United States Patent [19]

Hefferon et al.

[11] Patent Number: 4,908,298
[45] Date of Patent: Mar. 13, 1990

[54] METHOD OF CREATING PATTERNED MULTILAYER FILMS FOR USE IN PRODUCTION OF SEMICONDUCTOR CIRCUITS AND SYSTEMS

[75] Inventors: George J. Hefferon, Fishkill, N.Y.; Hiroshi Ito, San Jose, Calif.; Scott A. MacDonald, San Jose, Calif.; Carlton G. Willson, San Jose, Calif.

[73] Assignee: International Business Machines Corporation, Armonk, N.Y.

[21] Appl. No.: 117,383

[22] Filed: Oct. 30, 1987

Related U.S. Application Data

[63] Continuation of Ser. No. 713,370, Mar. 19, 1985, abandoned.

[51] Int. Cl.⁴ .............................................. G03C 5/00
[52] U.S. Cl. ................................ 430/313; 430/317; 430/325; 430/326; 430/328; 156/628
[58] Field of Search ............. 430/311, 313, 317, 325, 430/326, 328, 394, 271, 331; 156/628

[56] References Cited

U.S. PATENT DOCUMENTS

| | | | |
|---|---|---|---|
| 3,652,274 | 3/1972 | Verelst et al. | 430/310 |
| 4,125,650 | 11/1978 | Chiu et al. | 427/337 |
| 4,396,704 | 8/1983 | Taylor | 430/311 |
| 4,426,247 | 1/1984 | Tamamura et al. | 156/643 |
| 4,657,845 | 4/1987 | Frechet et al. | 430/326 |
| 4,751,170 | 6/1988 | Mimura et al. | 430/296 |

FOREIGN PATENT DOCUMENTS

| | | |
|---|---|---|
| 0136130 | 4/1985 | European Pat. Off. |
| 0161476 | 11/1985 | European Pat. Off. |
| 184567 | 6/1986 | European Pat. Off. |
| 0187421 | 7/1986 | European Pat. Off. |
| 2097143 | 4/1982 | United Kingdom |
| 2154330 | 9/1985 | United Kingdom |

OTHER PUBLICATIONS

G. N. Taylor Solid State Technology, vol. 27, No. 2, Feb. 1984, pp. 145–155.
T. M. Wolf et al., Journal of Electro Chemical Society, vol. 131, No. 7, Jul. 1984, pp. 1664–1670.
D. Follett et al., Extended Abstracts, vol. 82-2, Oct. 1982, pp. 321–322, Abstract No. 201.

*Primary Examiner*—Jose Dees
*Attorney, Agent, or Firm*—John A. Stemwedel

[57] ABSTRACT

A method is provided for creating multilayer patterned films wherein at least one layer is an etch-resistant patterned layer, and wherein either positive or negative tone patterns can be obtained.

The etch-resistant patterned layer is obtained by reacting a patterned polymeric film containing reactive functional groups with an organometallic reagent such as a silicon-containing compound. The pattern is subsequently transferred through adjacent polymeric layers using an oxygen plasma or equivalent dry-etch method.

15 Claims, 4 Drawing Sheets

METHOD OF CREATING PATTERNED MULTILAYER FILMS FOR USE IN PRODUCTION OF SEMICONDUCTOR CIRCUITS AND SYSTEMS

This application is a continuation of application Ser. No. 713,370, filed Mar. 19, 1985, now abandoned.

BACKGROUND OF THE INVENTION

1. Technical Field

The present invention is concerned with multilayer films which are used in the production of semiconductor circuits and systems. The films may become a permanent part of the circuit or system; or, they may be used as masks which are removed during processing, so that they do not become part of the final circuit or system.

The present invention is particularly concerned with a method of producing multilayer polymeric films wherein at least one of the layers is etch-resistant.

2. Background Art

In the manufacture of semiconductor chips and systems, including packaging, multilayer films are used as insulators, semiconductors, and conductors. In the production of patterned devices, multilayer films are often used to achieve pattern transfer.

An example of the pattern transfer application is the use of multilayer films as masks during processing steps. Frequently the multilayer masking films are polymeric, due to ease of use and the relatively low cost of such materials. Depending on the pattern to be transferred, the multilayer mask may be comprised of several different polymeric materials, each material to accomplish a specific task. For example, a substrate to which a mask is to be applied may exhibit a multitude of geometries, necessitating the use of a planarizing layer prior to the layer of masking which is patterned (the imaging layer), in order to provide accuracy during patterning. Once the imaging layer has been patterned, it is necessary to transfer the pattern through the planarizing layer to the substrate. A current trend in the semiconductor industry is to use dry etching techniques to transfer the pattern through the planarizing layer. This is because conventional wet processes, which utilize solvent to transfer the pattern in the imaging layer through the planarizing layer, do not provide the anisotropic removal mechanism considered necessary to achieve optimal dimensional control within the parameters of today's systems.

Examples of dry-developable multilayer patterned films (resists) are provided in U.S. Pat. Nos. 4,426,247 to Tamamura et al., 4,433,044 to Meyer et al., 4,357,369 to Kilichowski et al., and 4,430,153 to Gleason et al. In all of the above patents, one of the resist layers comprises a silicon-containing polymer. The silicon-containing layer is imaged and developed into a pattern. Subsequently, the patterned layer of resist is exposed to an oxygen plasma or to reactive ion etching; this causes the formation of silicon oxides in the patterned layer, which protect underlaying polymeric layers and permit transfer of the pattern through the underlying polymeric layers.

Recently, processes have been developed which permit selective conversion of portions of a non-silicon-containing resist layer to a silicon-containing, etch-resistant form. The resist layer is imaged but not developed, and the latent image within the layer is reacted with an organometallic reagent to incorporate an oxide-forming metal such as silicon into the image. The latent image is then dry developable, and the etch-resistant images, as well as underlying planarizing layers, can then be dry etched using an oxygen plasma to simultaneously develop and transfer the pattern through to the substrate below.

Examples of this latter method of obtaining dry-developable multilayer resists are described in U.S. Pat. No. 4,552,833 to Ito et al., and in U.S. patent application Ser. No. 679,527 (assigned to the assignee of the present invention). The disclosures of U.S. Pat. No. 4,552,833 and U.S. patent application are incorporated herein by reference.

However, the methods of creating dry-developable multilayer resists described in the two referencies above provide a negative tone pattern, and many practitioners within the semiconductor industry prefer to use a positive tone pattern. In addition, the two methods described present problems on application to novolak resist materials of the type most commonly used in semiconductor industry lithography.

SUMMARY OF THE INVENTION

In accordance with the present invention, a method is provided for creating multilayer films wherein at least one layer is a patterned, etch-resistant layer, and wherein either positive or negative tone patterns can be obtained. An etchant such as oxygen plasma can then be used to transfer the pattern in the etch-resistant layer through any adjacent polymeric layers shielded by the etch-resistant, patterned layer, such as (but not limited to) underlying layers.

One of the preferred embodiments of the present invention discloses a method of producing multilayer films for use in the production of semiconductor circuits and systems, wherein at least one of the multilayers is etch-resistant, comprising:

(a) applying an imaging layer of polymeric material over the surface of at least one underlayer of polymeric material;

(b) creating a latent image within said imaging layer;

(c) developing said latent image to create a patterned layer of polymeric material over the surface of said at least one underlayer of polymeric material; and (d) reacting said patterned layer of polymeric material with an organometallic reagent in order to render said patterned layer of polymeric material etch-resistant.

In the above embodiment, when the layer of radiation-sensitive material is capable of reacting with the organometallic reagent prior to irradiation and after development of the image, a positive tone pattern can be obtained if the irradiated portion of the radiation-sensitive material can be selectively removed in development step (c). The portion of the layer of radiation-sensitive material remaining after step (c) can be directly reacted with the organometallic reagent. A negative tone pattern can be obtained if the irradiated portion of the radiation-sensitive material becomes selectively resistant to the development process of step (c), so that it is the non-irradiated portion of the layer which is removed upon development. The irradiated portion of the layer remaining after development can be subsequently reacted with the organometallic reagent.

In another preferred embodiment, wherein the image within the radiation-sensitive material cannot be developed to provide the desired pattern directly after irradiation, it is necessary to carry out an additional reaction step prior to development of the image. In such case, the method comprises the same steps (a) and (b) followed by a step (c) in which the layer of radiation-sensitive material is further reacted in order to alter its development characteristics, step (d) in which the reacted image is developed to create a pattern upon the surface of the at least one layer of polymeric material, and step (e) in which the developed image is reacted with an organometallic reagent in order to create an etch-resistant material. Again, either a positive or a negative tone pattern can be obtained, depending upon the effect of steps (b), (c) and (d) upon the particular radiation-sensitive material used.

In both of the above embodiments, the radiation-sensitive material is capable of reacting with the organometallic reagent prior to irradiation and after development of the image. The purpose of the radiation is to create the image only, and the purpose of any additional reaction steps following irradiation but prior to development of the image is to distinguish the solubility characteristics of the originally irradiated and non-irradiated areas, to provide the desired pattern tone upon development.

There are additional embodiments of the present invention in which the radiation-sensitive material is not capable of reacting with the organometallic reagent prior to irradiation. In these embodiments, radiation is required to initiate a reaction which alters the chemical composition of the radiation-sensitive material so that it is capable of reacting with the organometallic reagent. Depending on the radiation-sensitive material, irradiation may be followed by an additional reaction step in order to obtain a material capable of reacting with the organometallic reagent.

In cases wherein the radiation-sensitive material is not capable of reacting with the organometallic reagent prior to irradiation, and it is desired to produce a positive tone pattern, the method of the present invention comprises:

(a) applying an imaging layer of polymeric material over the surface of at least one underlayer of polymeric material;

(b) creating a latent image within said imaging layer;

(c) developing said latent image to create a positive tone pattern over the surface of said at least one underlayer of polymeric material;

(d) exposing the developed, patterned layer of radiation-sensitive material to radiation; and (e) reacting the developed, irradiated layer of step (d) with an organometallic reagent in order to create an etch-resistant material.

The additional irradiation of the developed image in step (d) is necessary, because the radiation-sensitive material remaining after development has not been irradiated, and is not capable of reacting with the organometallic reagent until after irradiation.

In cases wherein the radiation-sensitive material is capable of reacting with the organometallic reagent only after irradiation, and it is desired to obtain a negative tone pattern, the method of the present invention is the same as above except that step (d) is excluded because it is no longer necessary.

In other embodiments of the present invention, wherein the radiation-sensitive material is not capable of reacting with the organometallic reagent prior to irradiation, and wherein irradiation alone is not sufficient to create either the desired development characteristics or sufficient capability of reacting with the organometallic reagent, it is necessary to carry out an additional reaction step. The additional reaction step may be carried out before development to obtain the desired development characteristics, or may be carried out before or after development to obtain sufficient capability of reacting with the organometallic reagent.

One example of the method of the present invention then comprises the same steps (a) and (b) as described above, followed by a step (c) in which the layer of radiation-sensitive material is further reacted in order to alter its development characteristics, reactivity, or both. Step (c) is followed by step (d) in which the reacted image is developed to create a pattern upon the surface of the at least one layer of polymeric material, and step (e) in which the developed image is reacted with an organometallic reagent in order to create an etch-resistant material. Again, either a positive or a negative tone pattern can be obtained, depending upon the radiation-sensitive material used and the particular combination of irradiation and development steps used.

In all of the above embodiments, once the etch-resistant material is created, oxygen plasma (or any functionally equivalent dry etchant) can be used to transfer the pattern in the etch-resistant layer through any adjacent polymeric layers shielded by the etch-resistant patterned layer.

The method of the present invention can be used to provide multilayered, patterned films for masking and for applications in which the patterned films become a permanent part of the circuit or system. In the latter case, it may be desirable to remove the patterned imaging layer subsequent to pattern transfer, or to carry out an additional reaction subsequent to pattern transfer which removes residual organometallic components and/or metallic compounds.

DESCRIPTION OF THE PREFERRED EMBODIMENTS

Preferred embodiments include examples wherein the layer of radiation-sensitive material is capable of reacting with the organometallic reagent both prior to irradiation and after development of the image. Radiation-sensitive materials meeting this requirement comprise polymeric materials which contain reactive functional groups such as OH, COOH, NH and SH. The form of the active groups may be altered during subsequent process steps in some cases, but reactive groups must remain in some form after development of the image. Typical polymeric materials of this type include novolaks, polyvinylphenols, and polyacrylates. The novolaks and polyvinylphenols are made radiation sensitive by addition of sensitizers such as diazoquinone derivatives, diazides, or azides.

Figure 1:
FIGS. 1 through 6 depict a series of process steps for producing a multilayered, patterned film with a positive tone pattern, wherein the upper film layer is etch-resistant, and wherein the upper film (imaging) layer contains reactive groups prior to irradiation and after development of the image.
Figure 2:
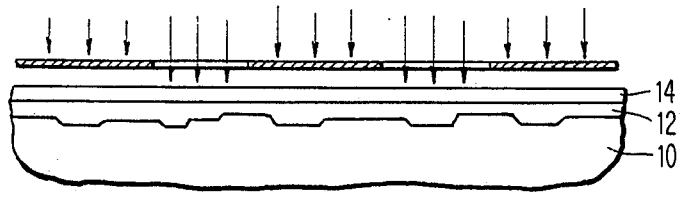
Figure 3:
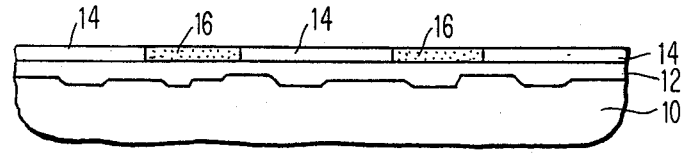

Multilayered films with a positive tone pattern, made using polymers of the type described above, are created by the method shown in FIGS. 1–6. Referring now to FIG. 1, a layer of a polymeric planarizing material 12 is applied over the surface of a substrate 10. The polymeric planarizing material need not contain any reactive groups; in fact, it is preferable that it does not. In addition, it is preferable that the planarizing layer be comprised of a material capable of withstanding high temperatures in order to permit subsequent high temperature processing steps. Such high temperature planarizing layers may be comprised of polyimides, or commercially available novolak photoresists which have been baked at temperatures higher than about 200° C in order to provide increased thermal stability and reduced capability to react with organometallic reagents, or other thermally stable polymers. A layer of radiation-sensitive material 14 is then applied over the surface of the polymeric planarizing material. The surface of the radiation-sensitive material 14 is then exposed to patterned radiation as shown in FIG. 2 in order to create an image 16 therein, as shown in FIG. 3.

For purposes of this discussion, those to follow, and the claims made herein, "radiation" should be interpreted to include both photon (ultraviolet light from 150 nm–600 nm) and radiation emission sources such as X-ray, electron beam, and ion beam. The particular radiation source used depends on the sensitivity of the polymer and sensitizers being used.

Figure 4:
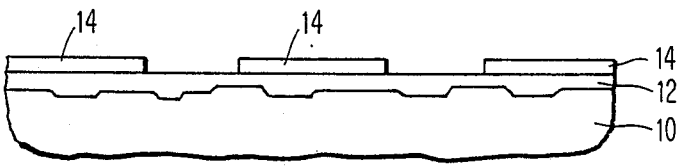

The image is subsequently developed to provide a positive tone pattern as shown in FIG. 4, by removal of the irradiated portions of the radiation-sensitive layer. Often this removal is accomplished using a solvent for the irradiated material, which solvent does not affect non-irradiated material.

Figure 5:
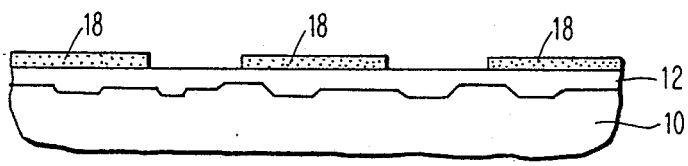
Figure 6:
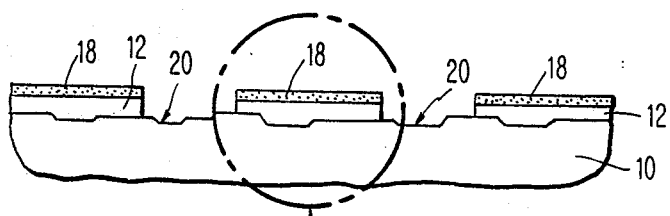
Figure 6:
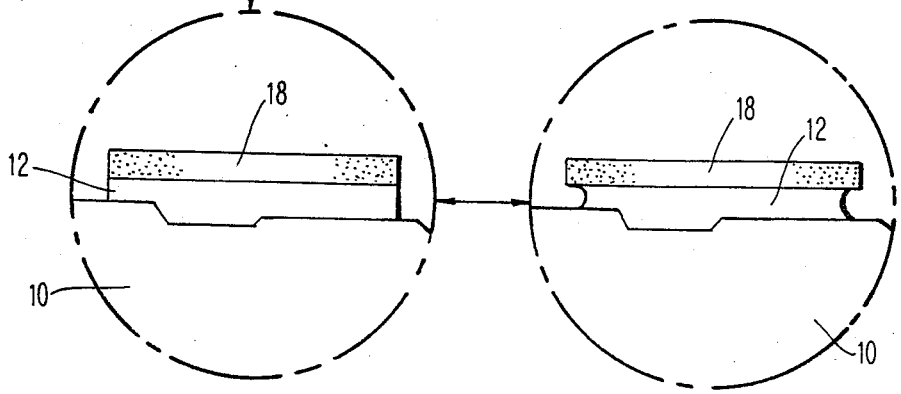

The developed pattern is now reacted with an organometallic reagent to provide an etch-resistant pattern 18, as depicted in FIG. 5. Oxygen plasma or reactive ion etching techniques can then be used to transfer the pattern of the etch-resistant layer 18 through the underlying planarizing layer 12, to the substrate surface 20, as shown in FIG. 6. Depending on the method and conditions of etching, the planarizing layer can be etched to have straight or undercut sidewalls as shown in the enlargement of FIG. 6.

The organometallic reagent used to render the radiation-sensitive material etch-resistant can be of the type described in U.S. Pat. No. 4,522,833 to Ito et al., and patent application Ser. No. 679,527, previously incorporated by reference. The reagent may also be of the type described in a patent application entitled "PLASMA-RESISTANT POLYMERIC MATERIAL, PREPARATION THEREOF, AND USE THEREOF" by Babich et al., filed simultaneously with this application, by the assignee of this application, and which is incorporated herein by reference.

Figure 7:
FIGS. 7 through 13 depict a series of process steps for producing a multilayered, patterned film with a negative tone pattern, wherein the upper film layer is etch-resistant, and wherein the upper film (imaging) layer contains reactive groups prior to irradiation and after development of the image.
Figure 8:
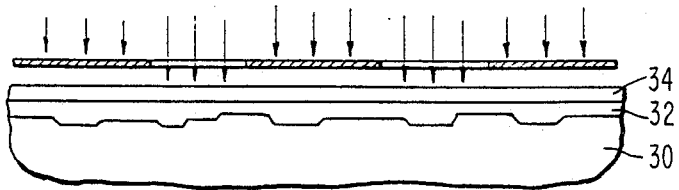
Figure 9:
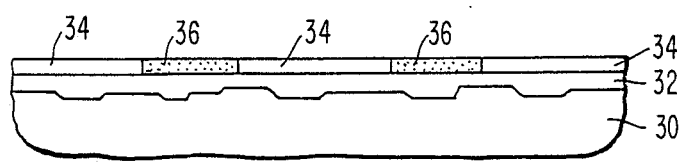

Multilayered films with a negative tone pattern are created by the method shown in FIGS. 7–13. Referring now to FIG. 7, a layer of a polymeric planarizing material 32 is applied over the surface of a substrate 30. It is preferable that the planarizing material 32 not contain groups which are reactive with the organometallic reagent. A layer of radiation-sensitive material 34 is then applied over the surface of the polymeric planarizing material 32. The surface of the radiation-sensitive material 34 is then exposed to patterned radiation as shown in FIG. 8, in order to create an image 36 therein, as shown in FIG. 9.

Figure 10:
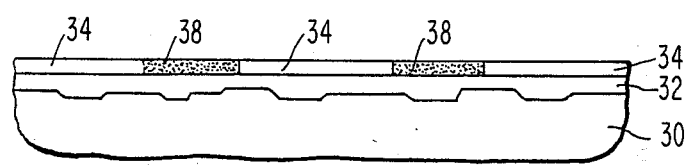

The image is subsequently developed by removal of the non-irradiated portions 34 of the imaging layer, in order to create a negative tone pattern. If the non-irradiated portions of the imaging layer 34 can be removed by a technique which does not affect the irradiated material 36 (such as dissolved in a solvent or selectively etched away), the image can be developed directly, to provide the structure shown in FIG. 11. If the irradiated image 36 and the non-irradiated material 34 are affected in the same manner by removal techniques, the irradiated image 36 must undergo an additional reaction step (as shown in FIG. 10) to alter its chemical structure or composition, so that the non-irradiated material 34 can be removed by techniques which do not affect the irradiated, reacted image 38.

Figure 11:
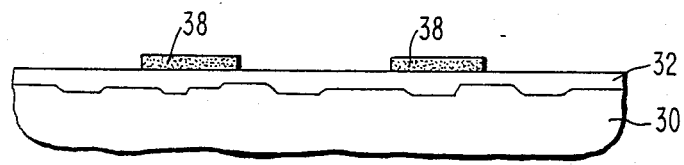
Figure 12:
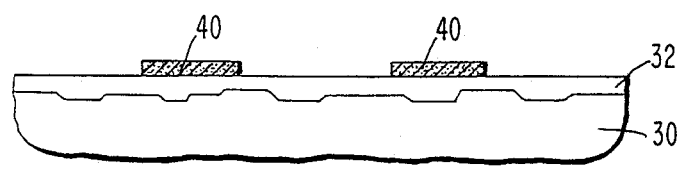
Figure 13:
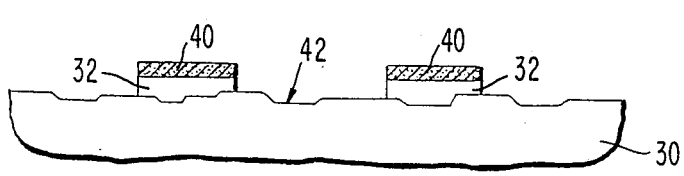

After development of the image as shown in FIG. 11, the developed pattern 38 is reacted with an organometallic reagent of the type previously discussed, to create an etch-resistant material 40, as shown in FIG. 12. Oxygen plasma or reactive ion etching techniques can then be used to transfer the pattern of the etch-resistant layer 40 through the underlying planarizing layer 32, to the substrate surface 42 as shown in FIG. 13.

Other preferred embodiments include examples wherein the radiation-resistant material is not capable of reacting with the organometallic reagent prior to irradiation. Two such systems for producing multilayered, patterned films are described in U.S. Pat. No. 4,552,833 to Ito et al. and U.S. patent application Ser. No. 679,527, previously incorporated by reference. The first of the above applications describes the use of polymeric materials combined with sensitizers, wherein the sensitizer generates an acid upon irradiation which is reacted with the polymeric material to generate reactive hydrogens on the polymeric material. Subsequently, the polymeric material is reacted with the organometallic reagent. Typical polymeric materials used in this method include poly(t-butyl methacrylate), poly (t-butyloxycarbonyloxystyrene), and copolymers thereof. Additional polymeric materials of this type are described in U.S. Pat. No. 4,491,628 to Ito et al., which is hereby incorporated by reference. The first application also describes the use of polymers such as poly(p-formyloxystyrene) which generate active hydrogens directly on irradiation so that it is not necessary to use a sensitizer. The second application describes additional systems which require no sensitizer. In these systems, functional groups which become reactive upon irradiation are attached to the desired polymer backbone. Typical of such functional groups are o-nitrobenzyl derivatives (which rearrange on exposure to radiation to form alcohols, acids, and amines), photo-fries reactive units, and diazoketones.

Figure 14:
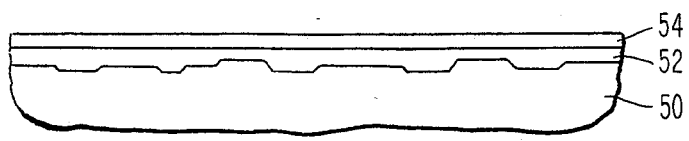
FIGS. 14 through 21 depict a series of process steps for producing a multilayered, patterned film with a positive tone pattern, wherein the upper film layer is etch-resistant, and wherein the upper film (imaging) layer is a radiation-sensitive material containing no reactive groups prior to irradiation, and wherein an additional reaction step is required to generate the desired form of active groups in the radiation-sensitive material.
Figure 15:
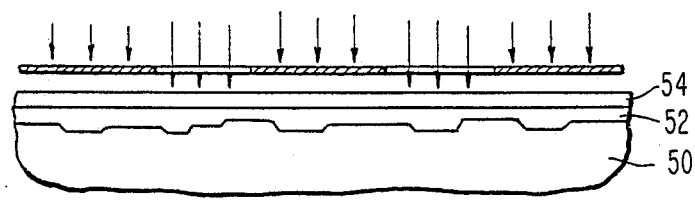
Figure 16:
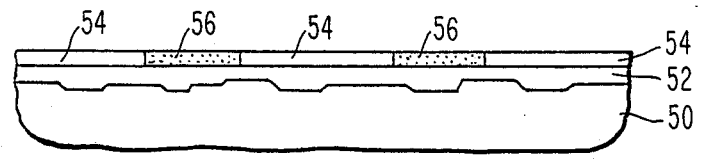

Multilayered films with a positive tone pattern, made using sensitized polymers of the type described above, are created by the method shown in FIGS. 14–21. Referring now to FIG. 14, a layer of polymeric planarizing material 52 is applied over the surface of a substrate 50. A layer of radiation-sensitive material 54 is then applied over the surface of the polymeric planarizing material 52. The surface of the radiation-sensitive material 54 is then exposed to patterned radiation as shown in FIG. 15, in order to create an image 56 therein, as shown in FIG. 16.

Figure 17:
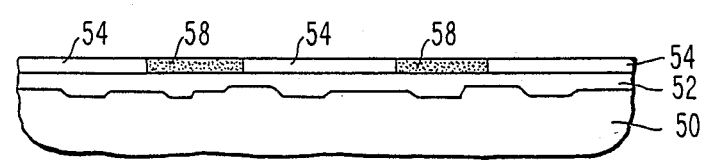
Figure 18:
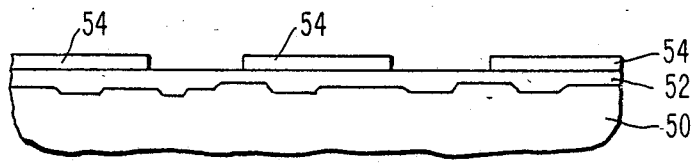

The image is subsequently developed by removal of the irradiated portions 56 of the imaging layer, in order to create a positive tone pattern. If the irradiated image 56 can be removed by a technique which does not affect the non-irradiated material 54 (such as dissolved in a solvent or selectively wet etched away), the image can be developed directly to provide the positive tone pattern shown in FIG. 18. If the irradiated image 56 and the non-irradiated material 54 are affected in the same manner by removal techniques, the irradiated image 56 must undergo an additional reaction step, as shown in FIG. 17, to alter its chemical structure or composition, so that it can be removed by techniques which do not affect the non-irradiated material 54. The chemically altered, irradiated image is depicted as 58 in FIG. 17. Subsequently, the irradiated, chemically altered image 58 can be developed as shown in FIG. 18.

Figure 19:
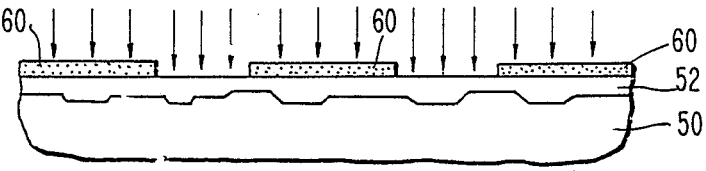

Since the imaging layer 54 remaining after development contains no reactive groups, it must be irradiated as shown in FIG. 19 to create the reactive groups, thus yielding an altered material 60. Again, if irradiation alone does not generate groups capable of reacting with the organometallic reagent, an additional reaction step may be required.

Figure 20:
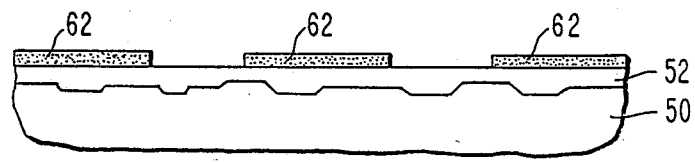
Figure 21:
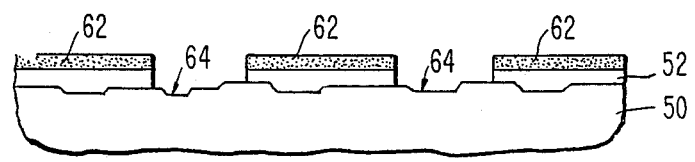

Subsequently, the altered imaging layer 60 is reacted with the organometallic reagent to produce the etch-resistant patterned layer 62 shown in FIG. 20. Oxyqen plasma or reactive ion etching techniques can then be used to transfer the pattern of the etch-resistant layer 62 through the underlying planarizing layer 52, to the substrate surface 64, as shown in FIG. 21.

Figure 22:
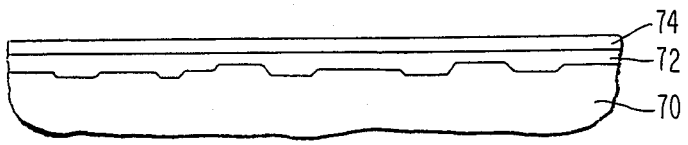
FIGS. 22 through 28 depict a series of process steps for producing a multilayered, patterned film with a negative tone pattern, wherein the upper film layer is etch-resistant, and wherein the upper film (imaging) layer is a radiation-sensitive material containing no reactive groups prior to irradiation, and wherein an additional reaction step is required to generate active groups in the radiation-sensitive material.
Figure 23:
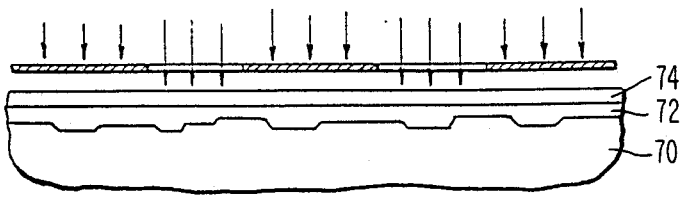
Figure 24:
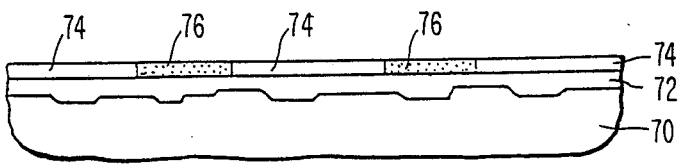

Multilayered films with a negative tone pattern are created by the method shown in FIGS. 22–28. Referring now to FIG. 22, a layer of a polymeric planarizing material 72 is applied over the surface of a substrate 70. A layer of radiation-sensitive material 74 is then applied over the surface of the polymeric planarizing material 72. The surface of the radiation-sensitive material 74 is then exposed to patterned radiation as shown in FIG. 23, in order to create an image 76 therein, as shown in FIG. 24.

Figure 25:
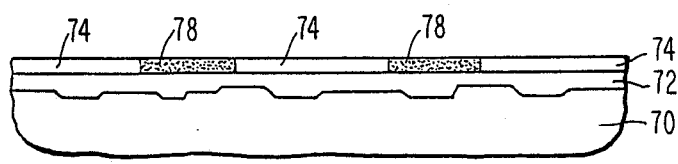
Figure 26:
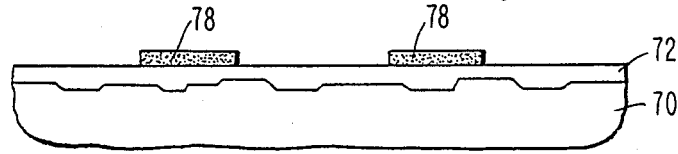

The image is subsequently developed by removal of the non-irradiated portions 74 of the imaging layer, in order to create a negative tone image. If the non-irradiated material 74 can be removed by a technique which does not affect the irradiated image 76, the image can be developed directly to provide the structure shown in FIG. 26. If the irradiated image 76 and the non-irradiated material 74 are affected in the same manner by removal techniques, the irradiated image 76 must undergo an additional reaction step, as shown in FIG. 25, to alter its chemical structure or composition so that the non-irradiated material 74 can be removed by techniques which do not affect the irradiated image 76. The chemically altered, irradiated image is depicted as 78 in FIG. 25. Subsequently, the chemically altered, irradiated image 78 can be developed as shown in FIG. 26.

Figure 27:
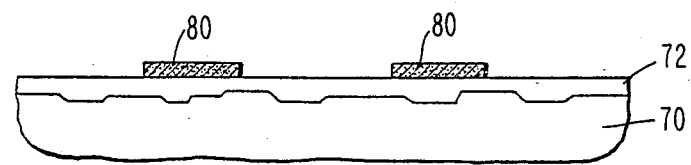
Figure 28:
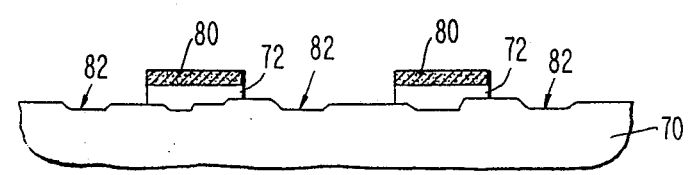

Since the imaged layer contains active groups created during earlier process steps, the developed image 78 can be reacted with the organometallic reagent as shown in FIG. 27, to create the etch-resistant, patterned layer 80. Oxygen plasma or reactive ion etching techniques can then be used to transfer the pattern of the etch-resistant layer 80 through the underlying planarizing layer 72, to the substrate surface 82 as shown in FIG. 28.

The various embodiments of the present invention provide for the creation of either negative or positive images; they permit the use of resist systems commonly used within the semiconductor industry; and they provide for wet development of the imaging layer, which is preferable in terms of cost of equipment required and processing rate.

EXAMPLES

Example 1

The first example is of a multilayer patterned film prepared using a polymer containing reactive groups prior to irradiation and after development of the image. The pattern produced was positive in tone and the upper layer of the multilayer patterned film was dry-etch resistant. The method used to prepare the multilayer patterned film was that depicted in FIGS. 1–6.

A (planarizing) layer of preimidized polyimide 12 was applied to a silicon wafer substrate 10 using standard spin coating techniques. The polyimide had a weight average molecular weight of about 70,000. The $\gamma$-butyrolactone carrier for the polyimide was subsequently removed using a 250° C. bake for a period of about 30 minutes. The thickness of the polyimide layer 12 was about 2.0 micrometers.

An imaging layer 14 of a novolak polymer resist sensitized with a diazoquinone derivative was applied by spin coating techniques over the surface of the polyimide layer 12. The ethyl cellosolve acetate carrier for the novolak-based resist was subsequently removed using an 85° C. bake for a period of about 30 minutes. The thickness of the novolak-based layer was about 1.2 micrometers. The structure produced was that shown in FIG. 1. The imaging layer 14 was imaged by contact printing, using near ultraviolet radiation at a dose of about 25 mJ/cm$^2$ as shown in FIG. 2, and the resultant structure was that shown in FIG. 3, wherein the image 16 is depicted.

The image was subsequently developed, using an aqueous base developer to remove the irradiated image material 16, so that the resulting structure was the positive tone pattern shown in FIG. 4. The developed image, as determined by scanning electron microscope, was sharp, indicating that no interlayer mixing had occurred between the planarizing layer 12 and the imaging layer 14.

After development of the image, the structure shown in FIG. 4 was exposed to the full output of a microlite 126 PC Photostabilizer (made by Fusion Systems Corporation) for about 30 seconds, and then exposed to the vapors of boiling hexamethyldisilazane (HMDS) for a period of about 45 minutes in order to produce the silicon-containing etch-resistant layer 18 shown in FIG. 5. Since the polyimide layer 12 contained no reactive groups, it was assumed there was no reaction of the HMDS with the polyimide layer.

The pattern of the etch-resistant imaged layer 18 was subsequently transferred through the polyimide layer 12 to the surface 20 of the silicon wafer substrate 10 by oxygen reactive ion etching using a parallel plate RIE tool.

Scanning electron micrographs of the two layer patterned film structure atop the silicon wafer substrate show a layer of the etch-resistant imaging material 18 capping the planarizing layer 12, wherein the planarizing layer exhibits straight side walls, and wherein the exposed substrate surface 20 exhibits no debris or apparent contamination.

Example 2

The second example is of a multilayer patterned film, prepared using a polymer containing no reactive groups prior to irradiation. The pattern created was positive in tone, and the upper layer of the patterned film was dry-etch resistant. The method used to prepare the multilayer patterned film was that depicted in FIGS. 14–21.

A layer of novolak polymeric material 52 was applied to the surface of a silicon wafer 50 by standard spin coating techniques. The carrier for the novolak was removed using an oven bake. The oven bake included a hard bake at a temperature over 200° C. to provide increased thermal stability and to reduce the ability of the organometallic reagent (used in subsequent process steps) to penetrate and react with functional groups within the novolak.

An imaging layer of poly(t-butoxycarbonyloxystyrene) (PBOCS) containing triphenylsulfonium hexafluoroarsenate (18.5% to the total solids) 54 was then applied over the surface of the novolak layer 52 using standard spin coating techniques. The cellosolve acetate carrier for the PBOCS-triphenyl-sulfonium hexafluoroarsenate was subsequently removed using a 100° C. bake for about 15 minutes. The structure produced was that shown in FIG. 14. The imaging layer 54 was then exposed to 254 nm radiation at a dosage of about 5 mJ/cm$^2$ as depicted in FIG. 15, in order to create the image 56 as shown in FIG. 16.

The latent image 56 in the PBOCS was then converted to a form exhibiting the desired reactive functionality 58 using an oven bake at about 100° C. for a period of about two minutes, as represented by FIG. 17.

The converted image 58 was subsequently developed to provide the positive tone image shown in FIG. 18 using an isopropyl alcohol developer solvent with an exposure period of about 2 minutes, followed by an isopropyl alcohol rinse.

Since the non-irradiated imaging layer 54 did not contain reactive groups after the above process steps, it was necessary to irradiate this material. The surface of the structure was flood exposed to about 5 mJ/cm of 254 nm radiation, as depicted in FIG. 19, followed by a 100° C. bake for a period of about 2 minutes in order to convert the PBOCS polymer to a form containing active hydrogens, represented by imaging layer 60.

The silicon wafer 50 with overlaying layers 52 and 60 was then placed in a vacuum oven at about 110° C. along with hexamethyldisilazane (HMDS) vapors at a pressure greater than 50 torr for a period of about 10 minutes. FIG. 20 shows the imaging layer 60 converted to a silicon-containing, etch-resistant material 62 after the reaction of the reactive hydrogens within layer 60 with the HMDS.

The pattern within the imaging layer 62 was subsequently transferred through the planarizing layer 52 to the surface 64 of the silicon wafer 50 by oxygen reactive ion etching using a Tegal parallel plate RIE tool.

Scanning electron micrographs of the two layer polymeric film structure atop the silicon wafer show that the planarizing layer exhibits straight sidewalls, and the surface 64 of the substrate 50 exhibits no debris.

The above process has also been demonstrated using PBOCS containing hexafluroantimonate at concentrations as low as about 4% by weight to the total solids. Additional resist compositions which combine a polymer having recurrent acid labile pendant groups with a cationic photoinitiator are described in U.S. Pat. No. 4,491,628 to Ito et al., previously incorporated by reference.

Example 3

The third example is of a multilayer patterned film, prepared using a polymer containing no reactive groups prior to irradiation. The pattern was created was negative in tone, and the upper layer of the patterned film was dry-etch resistant. The method used to prepare the multilayer patterned film was that depicted in FIGS. 22–28.

A layer of novolak photoresist polymeric material 72 was applied to the surface of a silicon wafer 70 by standard spin coating techniques. The carrier for the novolak polymer was subsequently removed using an oven bake. The resulting thickness of the novolak layer 72 was about 2 to 4 micrometers.

An imaging layer of poly(t-butoxycarbonyloxystyrene) (PBOCS) containing triphenylsulfonium hexafluoroarsenate (18.5% to the total solids) 74 was then applied over the surface of the novolak layer 72 using standard spin coating techniques. The cellosolve acetate carrier for the PBOCS-triphenyl-sulfonium hexafluoroarsenate was subsequently removed using an oven bake at about 100° C. bake for about 15 minutes. The thickness of the PBCOS imaging layer 74 was about one micrometer. The structure produced was that shown in FIG. 22.

The imaging layer 74 was exposed to about 5 mJ/cm$^2$ of 254 nm radiation as depicted in FIG. 23, in order to create the latent image 76 as shown in FIG. 24. The imaging layer was subsequently oven baked at about 100° C. for a few minutes in order to create reactive functional groups within the PBOCS, as depicted in FIG. 25, which shows the chemically altered image 78.

The image was then developed using an anisole developer for a period of about 2 minutes, followed by a rinse in anisole. A negative tone pattern was created, as shown in FIG. 26.

The silicon wafer 70 with overlaying layers 72 and 78 was then placed in a vacuum oven and reacted with HMDS as described in Example 2. FIG. 27 shows the imaging layer 78 after reaction with the HMDS to create the etch-resistant form of material 80.

The pattern within the etch-resistant imaging layer 80 was transferred through the planarizing layer 52 to the surface 82 of the silicon wafer 70 by reactive ion etching, as depicted in FIG. 28.

Scanning electron micrographs of the two layer film structure atop the silicon wafer show a cap of imaging layer 80 overlaying planarizing layer 72 , wherein the planarizing layer exhibits slightly undercut sidewalls.

Only preferred embodiments of the invention have been described above, and one skilled in the art will recognize that numerous substitutions, modifications, and alterations are permissible without departing from the spirit and scope of the invention, as demonstrated in the following claims.

What is claimed is:

1. A method of creating patterned multilayer films for use in the production of semiconductor circuits, and systems wherein at least one of said multilayers is etch-resistant, comprising:
   (a) applying an imaging layer of polymeric material over the surface of at least one underlaying layer of polymeric material;
   (b) using radiation to create a latent image within said imaging layer;
   (c) developing said latent image to create a patterned layer of polymeric material over the surface of said at least one underlaying layer of polymeric material;
   (d) altering said developed, patterned layer of polymeric material so that it is capable of reacting with an organometallic reagent; and
   (e) reacting said patterned layer of polymeric material with an organometallic reagent in order to render said patterned layer of polymeric material etch resistant.

2. A method of creating patterned multilayer films for use in the production of semiconductor circuits and systems wherein at least one of said multilayers is etch-resistant, comprising:
   (a) applying an imaging layer of polymeric material over the surface of at least one underlaying layer of polymeric material;
   (b) using radiation to create a latent image within said imaging layer;
   (c) altering said imaged layer in order to promote subsequent development capabilities, and in order to enable the subsequently developed image to sufficiently react with organometallic reagents, or for either of the preceding purposes;
   (d) developing said altered image layer to create a patterned layer of polymeric material over the surface of said at least one underlaying layer of polymeric material; and
   (e) reacting said patterned layer of polymeric material with an organometallic reagent in order to render said patterned layer of polymeric material etch-resistant.

3. A method of producing multilayer films for use in the production of semiconductor circuits and systems, wherein at least one of said multilayers is etch-resistant, comprising:
   (a) applying at least one layer of polymeric material to the surface of a substrate;
   (b) applying a layer of radiation-sensitive material over the surface of said at least one layer of polymeric material;
   (c) exposing at least a portion of said layer of radiation-sensitive material to radiation, in order to create a latent image therein;
   (d) reacting the irradiated portion of said radiation-sensitive material with a reagent to alter its chemical structure or composition to produce a material with different development characteristics from the irradiated portion of said radiation-sensitive material;
   (e) exposing at least the previously unexposed portions of the layer of radiation-sensitive material to radiation;
   (f) developing said layer of radiation-sensitive material to remove the portions exposed in step (e), creating a pattern upon the surface of said at least one layer of polymeric material; and
   (g) reacting said developed, patterned layer with an organometallic reagent in order to create an etch resistant material.

4. The method of claim 3 wherein the portions of said layer of radiation sensitive material which are irradiated in step (c) contain functional groups capable of reacting with said organometallic reagent both prior to irradiation in step (c) and after the irradiation in step (e).

5. The method of claim 4 wherein said radiation-sensitive material is comprised of a polymeric material selected from the group consisting of novolaks and polyvinylphenols.

6. A method of producing multilayer films for use in the production of semiconductor circuits and systems, wherein at least one of said multilayers is etch-resistant, comprising:
   (a) applying at least one layer of polymeric material to the surface of a substrate;
   (b) applying a layer of radiation-sensitive polymeric material containing reactive functional groups in selected from the group consisting of OH, COOH, NH, and SH, over the surface of said at least one layer of polymeric material;
   (c) exposing at least a portion of said layer of radiation-sensitive material to radiation, in order to create a latent image therein;
   (d) reacting the irradiated portion of said radiation-sensitive material to alter its chemical structure and composition to produce a material with development characteristics different from the irradiated portion of the radiation-sensitive material;
   (e) exposing at least the previously unexposed portions of the layer of radiation-sensitive material to radiation;
   (f) developing said latent image within said layer of radiation-sensitive material to remove the portions exposed in step (e), creating a pattern upon the surface of said at least one layer of polymeric material;
   (g) reacting said developed, patterned layer with an organometallic reagent in order to create an etch-resistant material.

7. A method of producing multilayer films for use in the production of semiconductor circuits and systems, wherein at least one of said multilayers is etch-resistant, comprising:
   (a) applying at least one layer of polymeric material to a substrate;
   (b) applying a layer of radiation-sensitive material, which is not capable of significantly reacting with an organometallic reagent prior to irradiation, over the surface of said at least one layer of polymeric material;
   (c) exposing at least a portion of said layer of radiation-sensitive material to radiation, in order to create a latent image containing reactive groups therein;
   (d) developing said layer of radiation-sensitive material to create a positive tone pattern upon the surface of said at least one layer of polymeric material;
   (e) exposing said developed, patterned layer of radiation-sensitive material to radiation in order to generate reactive groups therein; and (f) reacting said patterned, exposed layer of step (e) with an organometallic reagent in order to create an etch-resistant material.

8. The method of claim 7 wherein said radiation-sensitive materials are polymers containing functional components selected from the group containing of o-nitrobenzene derivatives (which rearrange on exposure to radiation to form alcohols, acids and amines), photo-fries reactive units and diazoketones.

9. A method of producing multilayer films for use in the production of semiconductor circuits and systems, wherein at least one of said multilayers is etch-resistant, comprising:
   (a) applying at least one layer of polymeric material to a substrate;
   (b) applying a layer of radiation-sensitive material over the surface of said at least one layer of polymeric material;
   (c) exposing at least a portion of said layer of radiation-sensitive material to radiation, in order to create a latent image therein;
   (d) reacting the irradiated portion of said radiation-sensitive material in order to produce a reacted material which is soluble in polar solvents or in an aqueous base;
   (e) developing said layer of radiation-sensitive material to create a positive tone pattern upon the surface of said at least one layer of polymeric material;
   (f) exposing said developed, patterned layer of radiation-sensitive material to radiation;
   (g) reacting the patterned, irradiated layer of step (f) to create a reacted material capable of reaction with an organometallic reagent; and
   (h) reacting said patterned, layer of step (g) with an organometallic reagent in order to create an etch-resistant material.

10. The method of claim 9 wherein said radiation-sensitive material is not capable of significantly reacting with said organometallic reagent prior to exposure to radiation.

11. The method of claim 10 wherein said radiation-sensitive material is selected from the group consisting of sensitized poly(t-butyl methacrylate) poly(t-butyloxycarbonyloxystyrene), and copolymers thereof.

12. A method of producing multilayer films for use in the production of semiconductor circuits and systems, wherein at least one of said multilayers is etch-resistant, comprising;
   (a) applying at least one layer of polymeric material to a substrate;
   (b) applying a layer of radiation-sensitive material over the surface of said at least one layer of polymeric material;
   (c) exposing at least a portion of said layer of radiation-sensitive material to radiation;
   (d) reacting the irradiated portion of said radiation-sensitive material in order to produce a reacted material which is soluble in polar solvents or in an aqueous base and which is capable of reacting with an organometallic reagent;
   (e) developing said layer of radiation-sensitive material to create a negative tone pattern upon the surface of said at least one layer of polymeric material; and
   (f) reacting said developed layer with an organometallic reagent in order to create an etch-resistant material.

13. The method of claim 12 wherein said radiation-sensitive material is not capable of significantly reacting with said organometallic reagent prior to exposure to radiation.

14. The method of claim 13 wherein said radiation-sensitive material is selected from the group consisting of sensitized poly (t-butyl methacrylate), poly (t-butyloxycarbonyloxystyrene), and copolymers thereof.

15. The method of claims 1, 2, 3, 6, 7, 9 or 12 including an additional step wherein the pattern in said etch-resistant, patterned layer is transferred to at least one of said at least one layers of polymeric material, using an oxygen plasma or reactive ion etching.

* * * * *